(12) United States Patent
Miyamoto et al.

(10) Patent No.: US 7,849,900 B2
(45) Date of Patent: Dec. 14, 2010

(54) APPARATUS FOR JOINING A SEPARATING ADHESIVE TAPE

(75) Inventors: Saburo Miyamoto, Mie-ken (JP); Yasuji Kaneshima, Mie-ken (JP); Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1168 days.

(21) Appl. No.: 11/358,140

(22) Filed: Feb. 22, 2006

(65) Prior Publication Data

US 2006/0219359 A1 Oct. 5, 2006

(30) Foreign Application Priority Data

| | | |
|---|---|---|
| Mar. 31, 2005 | (JP) | 2005-102346 |
| Jul. 6, 2005 | (JP) | 2005-197593 |
| Nov. 17, 2005 | (JP) | 2005-332858 |

(51) Int. Cl.
*B29C 65/18* (2006.01)
(52) U.S. Cl. .................. 156/379.8; 156/379.6; 156/584
(58) Field of Classification Search .............. 156/379.8, 156/379.6, 580
See application file for complete search history.

(56) References Cited

U.S. PATENT DOCUMENTS

| | | | | |
|---|---|---|---|---|
| 4,631,103 A | * | 12/1986 | Ametani | 156/241 |
| 4,870,288 A | * | 9/1989 | Abuku et al. | 250/548 |
| 5,009,735 A | * | 4/1991 | Ametani et al. | 156/241 |
| 5,254,201 A | | 10/1993 | Konda et al. | |
| 6,238,515 B1 | * | 5/2001 | Tsujimoto et al. | 156/379.8 |
| 2003/0064592 A1 | * | 4/2003 | Yamamoto | 438/689 |
| 2003/0092288 A1 | * | 5/2003 | Yamamoto et al. | 438/800 |
| 2005/0205204 A1 | * | 9/2005 | Kurosawa et al. | 156/344 |

FOREIGN PATENT DOCUMENTS

| | | |
|---|---|---|
| CN | 1409380 A | 4/2003 |
| JP | 5-63077 | 3/1993 |

OTHER PUBLICATIONS

Chinese Office Action for the Application No. 2006100720065 dated Nov. 7, 2008.

* cited by examiner

*Primary Examiner*—Khanh Nguyen
*Assistant Examiner*—Vishal I Patel
(74) *Attorney, Agent, or Firm*—Cheng Law Group, PLLC

(57) ABSTRACT

During relative and horizontal movement of a mount frame, in which a semiconductor wafer with a protective tape is supported on a ring frame through a supporting adhesive tape, and a joining member, a position of an end edge of the protective tape is detected in a non-contact manner. Based on the detection result, a joining member is stopped in the position of the end edge of the protective tape and is moved close to the semiconductor wafer to press and bring a separation tape against and into contact with an end of the protective tape. In this state, the mount frame and the joining member are relatively and horizontally moved to join the separation tape onto the protective tape. Then, the mount frame and the joining member are relatively and horizontally moved to separate the separation tape together with the protective tape from a surface of the semiconductor wafer.

9 Claims, 13 Drawing Sheets

APPARATUS FOR JOINING A SEPARATING ADHESIVE TAPE

BACKGROUND OF THE INVENTION (1) Field of the Invention

The present invention relates to a protective tape separating method for joining a separating adhesive tape or the like while pressing its non-adhesive face with a joining member onto protective tape joined to a surface of a semiconductor wafer held from its back face by a ring frame through a supporting adhesive tape, and separating the separating adhesive tape or the like, thereby separating the protective tape together with the separating adhesive tape or the like from the surface of the semiconductor wafer, and also relates to an apparatus using this method.

(2) Description of the Related Art

As means to thin a semiconductor wafer (hereinafter, simply referred to as "wafer"), there are mechanical methods such as grinding and polishing and a chemical method utilizing etching. In working the wafer by utilizing these methods, in order to protect a surface of the wafer formed with a wiring pattern, a protective tape is joined to the surface. The wafer on which the protective tape has been joined and which has been subjected to polishing is adhered to and held by a ring frame through a supporting adhesive tape from a back face. Then, the protective tape is separated and removed from the surface of the wafer held by the ring frame.

As a method for separating and removing the protective tape, there is a known method in which a separating adhesive tape or the like is joined to a surface of the protective tape through a joining member such as a roller or an edge member and is separated, removed, and reeled together with the protective tape from the surface of the wafer by separating the separating adhesive tape or the like (for example, see JP-A 05-63077 (1993)).

However, the aforementioned conventional protective tape separating method has the following problems.

In recent years, there is a demand for a thinner wafer so as to permit high-density packaging as applications progress rapidly and the wafer has been thinned to 150 µm or less. Therefore, in the semiconductor wafer adhered and held at a center of the ring frame through the supporting adhesive tape, a height from an adhesive face of the supporting adhesive tape exposed between the wafer and the ring frame to the surface of the wafer is low. As a result, when the separating adhesive tape or the like is wound on the joining member such as the roller and the edge member and joined to the protective tape joined to the surface of the wafer held by the ring frame, the separating adhesive tape or the like falls at an end edge of the wafer and the adhesive face of the supporting adhesive tape and an adhesive face of the separating adhesive tape or the like adhere to each other. If the separating adhesive tape or the like is separated in this state, the wafer is lifted together with the supporting adhesive tape and broken.

If the joining member is stopped before the end edge of the wafer so as to avoid the above problem, the separating adhesive tape or the like is not joined at the end edge of the protective tape. If the separating adhesive tape or the like is separated in this state, the protective tape cannot smoothly be separated from the end edge and a separation error may occur.

SUMMARY OF THE INVENTION

The present invention has been made in view of these circumstances and it is a main object of the present invention to provide a protective tape separating method for joining a separating adhesive tape or the like onto a protective tape joined to a surface of a semiconductor wafer held by a ring frame through a supporting adhesive tape and for accurately separating the protective tape together with the separating adhesive tape or the like from the semiconductor wafer by separating the separating adhesive tape or the like, and an apparatus using the method.

In order to achieve the above object, the present invention employs the following configuration.

A method for joining a separating adhesive tape or the like while pressing it from its non-adhesive face side with a joining member onto a protective tape joined to a surface of a semiconductor wafer held on a ring frame through a supporting adhesive tape, and separating the separating adhesive tape or the like, thereby separating the protective tape together with the separating adhesive tape or the like from the surface of the semiconductor wafer, the method comprising:

a detecting step of detecting a position of an end edge of the protective tape during relative movement of a mount frame, in which the semiconductor wafer with the protective tape is supported on the ring frame through the supporting adhesive tape, and the joining member along a direction of a face of the protective tape;

a positioning step of stopping the joining member at the position of the end edge on the basis of a detection result of the detecting means;

a step of relatively moving the joining member around which the separating adhesive tape or the like is wound close to the mount frame to press and bring the separating adhesive tape or the like against and into contact with the protective tape on the face of the semiconductor wafer after positioning of the joining member;

a joining step of relatively moving the mount frame and the joining member along the direction of the face of the protective tape while pressing the separating adhesive tape or the like against the protective tape with the joining member to join the separating adhesive tape or the like onto the protective tape; and a separating step of relatively moving the mount frame and the joining member along the direction of the face of the protective tape to separate the separating adhesive tape or the like and the protective tape together from the surface of the semiconductor wafer.

With this method, during relative movement of the mount frame and the joining member along the direction of the face of the protective tape, the end edge of the protective tape joined to the semiconductor wafer is detected. At a time point of this detection, the detected end edge is in a position at a predetermined distance known in advance from the joining member. If the relative movement is stopped at a time point when the mount frame and the joining member have moved relatively over the predetermined distance from the time point of this detection, the joining member is in the position facing the end edge of the protective tape. Because the joining member around which the separating adhesive tape is wound is moved close to the mount frame in this state, the joining member does not fall from the end edge of the semiconductor wafer and the separating adhesive tape or the like can be joined onto the end edge of the protective tape.

Then, the mount frame and the joining member are relatively moved along the direction of the face of the protective tape while pressing the joining member against the protective tape to thereby join the separating adhesive tape or the like onto the protective tape. The joined separating adhesive tape or the like is separated by relatively moving the mount frame and the joining member along the direction of the face of the protective tape. Therefore, the protective tape on the end edge of which the separating adhesive tape or the like is joined is separated together with the separating adhesive tape or the like from the surface of the semiconductor wafer.

As a result, the separating adhesive tape or the like can be joined to the end edge of the protective tape without lying off or short of the end edge and therefore the protective tape and the separating adhesive tape or the like can reliably be separated together from the end edge of the semiconductor wafer.

In this method, the joining step and the separating step may be carried out simultaneously. In this case, the separating adhesive tape or the like wound around the joining member is pressed against and brought into contact with the end edge of the protective tape. Then, as the mount frame and the joining member relatively move along the direction of the face of the protective tape, the joining and separating of the separating adhesive tape or the like proceed simultaneously at the contact portion and the protective tape is separated successively from the end edge on which joining of the separating adhesive tape or the like started.

The separating step may be carried out by relatively moving the mount frame and the joining member in opposite directions along the direction of the face of the protective tape after completion of the joining step. In this case, the separating adhesive tape or the like wound around the joining member is first pressed against and brought into contact with the front end edge of the protective tape. Then, by the relative movement of the mount frame and the joining member, the separating adhesive tape or the like is joined along the protective tape. On the basis of the detection information of the end edge of the protective tape, the relative movement of the mount frame and the joining member is stopped at the time point when the joining member has reached the rear end edge of the protective tape. In this way, the separating adhesive tape or the like can be joined without overshooting the rear end edge of the protective tape and without leaving an area on which the separating adhesive tape or the like is not joined. Then, the mount frame and the joining member are relatively moved in opposite directions and the protective tape is separated successively from the rear end edge as the separating adhesive tape or the like is separated.

To the joining member, an edge member having a sharp tip end, a roller, and the like can be applied. For example, if the joining member is the edge member, the separating adhesive tape or the like comes in contact with the protective tape through a narrow linear area and it is easy to determine the joining position. Thus, the joining termination position can accurately be stopped at the end edge of the wafer, i.e., the end edge of the protective tape to thereby suitably carry out any of the methods of the first to third inventions.

The detecting step preferably detects the position of the end edge of the protective tape in a non-contact manner.

In order to achieve the above object, the present invention also employs the following configuration.

An apparatus for joining a separating adhesive tape or the like while pressing it from its non-adhesive face side with a joining member onto a protective tape joined to a surface of a semiconductor wafer held on a ring frame through a supporting adhesive tape, and separating the separating adhesive tape or the like, thereby separating the protective tape together with the separating adhesive tape or the like from the surface of the semiconductor wafer, the apparatus comprising:

holding means on and by which a mount frame, in which the semiconductor wafer with the protective tape is supported on the ring frame through the supporting adhesive tape, is mounted and held horizontally;

separating adhesive tape or the like supplying means for supplying the strip type of separating adhesive tape or the like toward the joining member;

ascending/descending means for relatively moving the joining member, around and to which the separating adhesive tape or the like is wound and supplied, upward/downward with respect to the holding means;

driving means for relatively and horizontally moving the holding means and the joining member;

detecting means for detecting a front end edge of the protective tape in a non-contact manner during the relative and horizontal movement of the holding means and the joining member;

controlling means for controlling the ascending/descending means so as to stop the horizontal movement at a time point when a joining operating portion of the joining member has reached a position directly above the front end edge of the protective tape and to relatively move the joining member close to the holding means to press the separating adhesive tape or the like wound around the joining member against the protective tape on the basis of a detection result of the detecting means and for controlling driving of the driving means so as to start the relative movement of the holding means and the joining member again from the stop position as a starting point to simultaneously separate the separating adhesive tape or the like onto the protective tape and separate the separating adhesive tape; and tape collecting means for collecting the protective tape integral with the separated separating adhesive tape or the like.

With this configuration, during the relative and forward movement of the mount frame with respect to the joining member, the front end edge of the protective tape joined to the semiconductor wafer is detected. At the time point of this detection, the detected front end edge is in the position at the predetermined distance which is known in advance from the joining member. If the relative and forward movement is stopped at the time point when the mount frame has relatively been moved further forward over the predetermined distance with respect to the joining member from the time point of this detection, the joining portion of the joining member is in a position facing the front end edge of the protective tape. By moving the joining member around which the separating adhesive tape or the like is wound close to the mount frame in this state, the joining member does not fall from the front end edge of the semiconductor wafer and the separating adhesive tape or the like can be joined to the front end of the protective tape.

Then, the mount frame is relatively moved further forward with respect to the joining member while the joining member is pressed against the protective tape to thereby join the separating adhesive tape or the like onto the protective tape and immediately reel and separate the joined separating adhesive tape or the like by the joining member. In other words, the protective tape is separated together with the separating adhesive tape or the like from the front end edge of the protective tape from the surface of the semiconductor wafer. In other words, it is possible to suitably realize the method of the first invention.

Here, it is preferable that the detecting means is disposed at a predetermined distance from the joining member in a horizontal direction and is formed to horizontally move together with the joining member with respect to the holding means.

With this configuration, during the relative and horizontal movement of the holding means and the joining member, the front end edge of the protective tape can precisely be detected in a non-contact manner to thereby suitably carry out the apparatus of the sixth invention.

As the detecting means, a reflection-type photosensor, an optical camera, and the like for emitting light with a predetermined wavelength toward the surface of the protective tape and receiving light reflected from the surface of the protective tape can be used.

With this configuration, the end edge of the protective tape can precisely be detected in a non-contact manner to thereby accurately stop the joining member at the desired joining start position and joining termination position.

The joining member is preferably formed of the edge member having a sharp tip end or the roller. The separating adhesive tape or the like is preferably a thermosetting adhesive tape. If the thermosetting adhesive tape is used, the apparatus preferably comprises heating means for heating the edge member.

With this configuration, the heating means heats the edge member to cause a polymerization reaction of the adhesive of the thermosetting adhesive tape while softening the adhesive. After the polymerization reaction of the adhesive has completed, the adhesive is cured by heat and firmly adheres to the protective tape. Therefore, the separating adhesive tape or the like can reliably and firmly be adhered to the end edge of the protective tape to thereby accurately separate the protective tape together with the separating adhesive tape or the like from the surface of the semiconductor wafer as the separating adhesive tape or the like is separated.

The control means may operate the driving means to drive the joining members for horizontal movement and ascent/descent with respect to the holding means or may operate the driving means to drive the holding means for horizontal movement and ascent/descent with respect to the joining member.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A semiconductor wafer mount apparatus provided with a protective tape separating apparatus of the present invention will be described below by reference to the drawings.

Figure 1:
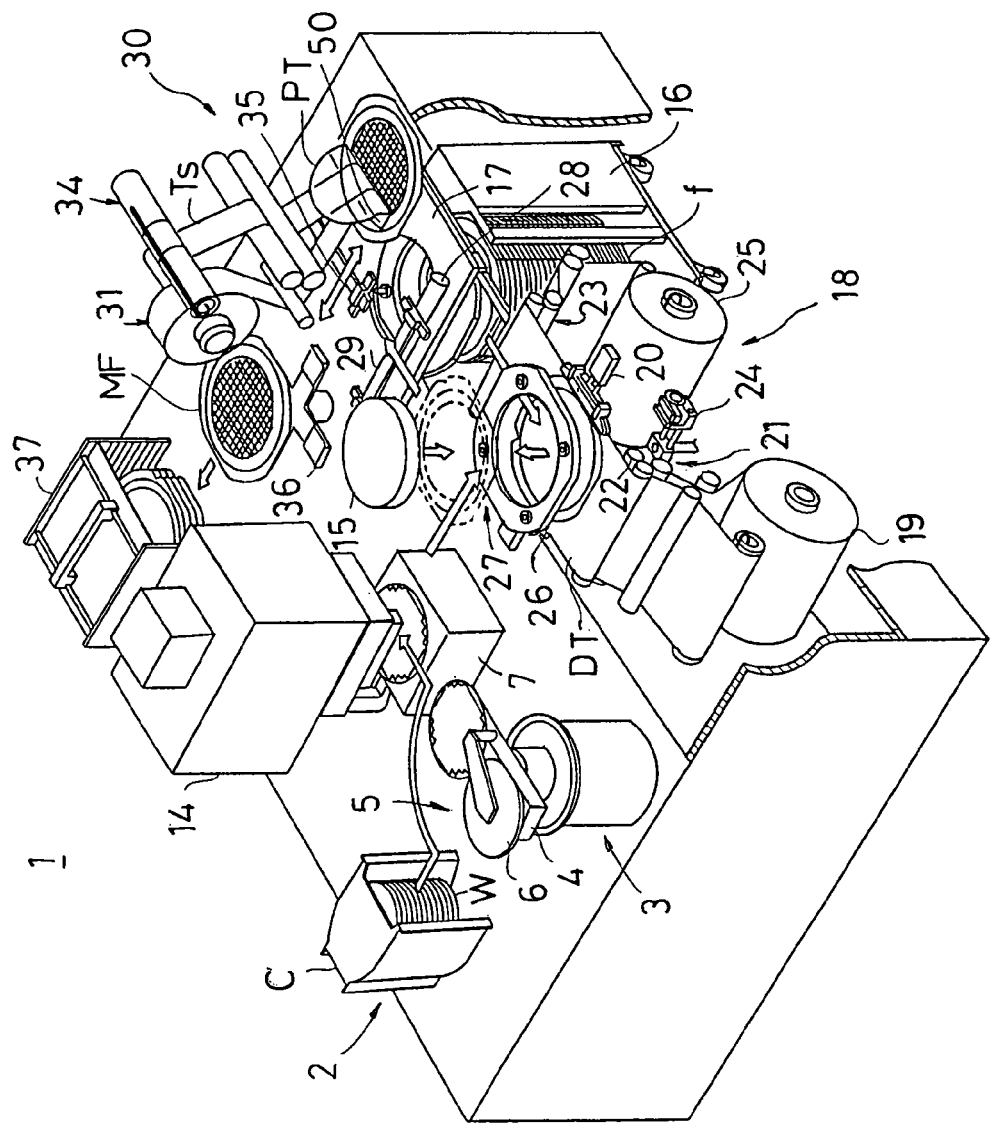
FIG. 1 is a general perspective view of a semiconductor wafer mount apparatus.

FIG. 1 is a cutaway perspective view of a whole configuration of the semiconductor wafer mount apparatus according to an embodiment of the present invention.

The semiconductor wafer mount apparatus 1 of this embodiment comprises: a wafer supply unit 2 in which a cassette C housing multiple-stacked wafers W is loaded, the wafers W having been subjected to back grinding; a wafer transportation mechanism 3 having a robot arm 4 and a pressing mechanism 5; an alignment stage 7 for bringing the wafer W into alignment; an ultraviolet irradiation unit 14 for irradiating the wafer W mounted on the alignment stage 7 with ultraviolet rays; a chuck table 15 for suction-holding the wafer W; a ring frame supply unit 16 for housing multiple-stacked ring frames f; a ring frame transportation mechanism 17 for transferring the ring frame f to a supporting adhesive tape DT serving as a dicing tape; a tape processing unit 18 for joining the supporting adhesive tape DT from a back face of the ring frame f; a ring frame ascending/descending mechanism 26 for moving upward/downward the ring frame f to which the supporting adhesive tape DT has been joined; a mount frame producing unit 27 for producing a mount frame MF formed by joining and integrating the wafer W to and with the ring frame f to which the supporting adhesive tape DT has been joined; a first mount frame transportation mechanism 29 for transporting the produced mount frame MF; a separation mechanism 30 for separating a protective tape PT joined to the surface of the wafer W; a second mount frame transportation mechanism 35 for transporting the mount frame MF from which the protective tape PT has been separated by the separation mechanism 30; a turn table 36 for turning the mount frame MF around and transporting the mount frame MF; and a mount frame collection unit 37 for housing multiple-stacked mount frames MF.

The wafer supply unit 2 is provided with a cassette stage (not shown). On this cassette stage, the cassette C housing multiple-stacked wafers W is mounted, the protective tape PT joined to a pattern face (hereinafter, referred to as "surface" as necessary) of each wafer W. At this time, the wafers W are in horizontal attitudes with their pattern faces up.

The wafer transportation mechanism 3 is formed to be turned and moved upward/downward by a drive mechanism (not shown). In other words, positions of a wafer holder of the robot arm 4 and a pressing plate 6 provided to the pressing mechanism 5 which will be described later are adjusted to transport the wafer W from the cassette C to the alignment stage 7.

The robot arm 4 of the wafer transportation mechanism 3 is provided at its tip end with the horseshoe-shaped wafer holder (not shown). The robot arm 4 is formed so that the wafer holder can move forward/backward in each of clearances between the multiple-stacked wafers W housed in the cassette C. A suction hole is provided in the wafer holder at the tip end of the robot arm to hold the wafer W by vacuum-suction of the wafer W from a back face.

The pressing mechanism 5 of the wafer transportation mechanism 3 is provided at its tip end with the circular pressing plate 6 substantially in the same shape as the wafer W and an arm portion can move forward/backward so that the pressing plate 6 moves to a position above the wafer W mounted on the alignment stage 7. The shape of the pressing plate 6 is not limited to a circle but may be any shapes as far as the plate 6 can correct the warpage appearing in the wafer W. For example, it is also possible to press a tip end of a rod-like object or the like against a warped portion of the wafer W.

The pressing mechanism 5 is actuated at an occurrence of a suction failure when the wafer W is mounted on a holding table of the alignment stage 7 which will be described later. To put it concretely, when the wafer W is warped and cannot be suction-held, the pressing plate 6 presses the surface of the wafer W to correct the warpage to make the wafer W flat. In this state, the holding table vacuum-sucks the wafer W from the back face.

The alignment stage 7 includes the holding table for bringing the wafer W mounted on the table into alignment on the basis of an orientation flat or a notch formed at an outer periphery of the table and for covering and vacuum-sucking the whole back face of the wafer W.

The alignment stage 7 detects a pressure value in vacuum-sucking the wafer W and compares the value with a reference value determined in advance in relation to a pressure value during normal operation (when the wafer W is sucked normally by the holding table). If the pressure value is higher than the reference value (i.e., a pressure in a suction pipe has not sufficiently reduced), it is determined that the wafer W is warped and is not sucked by the holding table. Therefore, the pressing plate 6 is actuated to press the wafer W to correct the warpage to thereby enable the wafer W to be sucked by the holding table.

The alignment stage 7 can transport the wafer W while suction-holding the wafer W from an initial position where the wafer W is mounted on the stage 7 and brought into alignment to an intermediate position between the chuck table 15 disposed in multiple stages above the tape processing unit 18 which will be described later and the ring frame ascending/descending mechanism 26. In other words, the alignment stage 7 corrects the warpage of the wafer W and transports it to the next step while holding it in a flat state.

The ultraviolet irradiation unit 14 is positioned above the alignment stage 7 in the initial position. The ultraviolet irradiation unit 14 irradiates with ultraviolet rays the protective tape PT which is an ultraviolet curing-type adhesive tape joined to the surface of the wafer W. In other words, adhesion of the protective tape PT is reduced by the ultraviolet irradiation.

The chuck table 15 is substantially in the same circular shape as the wafer W so as to cover and vacuum-suck the surface of the wafer W and is moved upward/downward from a standby position above the tape processing unit 18 to a position for joining the wafer W onto the ring frame f by a drive mechanism (not shown).

In other words, the chuck table 15 comes in contact with and suction-holds the wafer W held flat with its warpage having been corrected by the holding table.

The chuck table 15 is fitted in an opening of the ring frame ascending/descending mechanism 26 for suction-holding the ring frame f to which the supporting adhesive tape DT which will be described later is joined from a back face and moves downward to a position where the wafer W comes in close contact with the supporting adhesive tape DT at a center of the ring frame f.

At this time, the chuck table 15 and the ring frame ascending/descending mechanism 26 are held by a holding mechanism (not shown).

The ring frame supply unit 16 is of a trolley-shaped type provided at its bottom portion with a pulley and is mounted in an apparatus main body. An upper portion of the ring frame supply unit 16 is open to slide-lift and feed the multiple-stacked ring frames f housed in the ring frame supply unit 16.

The ring frame transportation mechanism 17 vacuum-sucks the ring frames f housed in the ring frame supply unit 16 one by one in downward order and transports each of the ring frames f to an alignment stage (not shown) and a position for joining the supporting adhesive tape DT. The ring frame transportation mechanism 17 also functions as a holding mechanism for holding the ring frame f in the position for joining the supporting adhesive tape DT in joining the supporting adhesive tape DT.

The tape processing unit 18 includes a tape supply unit 19 for supplying the supporting adhesive tape DT, a tension mechanism 20 for applying tension to the supporting adhesive tape DT, a joining unit 21 for joining the supporting adhesive tape DT to the ring frame f, a cutter mechanism 24 for cutting the supporting adhesive tape DT joined to the ring frame f, a separation unit 23 for separating an unnecessary tape after cutting by the cutter mechanism 24 from the ring frame f, and a tape collection unit 25 for collecting an unnecessary remaining tape after cutting.

The tension mechanism 20 pinches the supporting adhesive tape DT from opposite ends in a width direction to apply tension in the tape width direction. In other words, if a soft supporting adhesive tape DT is used, longitudinal creases are generated in a surface of the supporting adhesive tape DT along the supplying direction due to the tension applied in the tape supplying direction. In order to avoid these longitudinal creases to uniformly join the supporting adhesive tape DT to the ring frame f, the tension is applied from the tape width direction side.

The joining unit 21 is disposed in a standby position diagonally below (leftward and diagonally below in FIG. 1) the ring frame f held above the supporting adhesive tape DT. The joining roller 22 provided to the joining unit 21 moves to a joining start position on a right side in the tape supplying direction at the same time as the ring frame f is transported to and held at the joining position of the supporting adhesive tape DT by the ring frame transportation mechanism 17 and supplying of the supporting adhesive tape DT from the tape supply unit 19 starts.

The joining roller 22 which has reached the joining start position moves upward to press and join the supporting adhesive tape DT onto the ring frame f and rolls from the joining start position toward a standby position to join the supporting adhesive tape DT onto the ring frame f while pressing the supporting adhesive tape DT.

The separation unit 23 separates, from the ring frame f, the unnecessary portion of the supporting adhesive tape DT which has been cut by the cutter mechanism 24 which will be described later. To put it concretely, when joining of the supporting adhesive tape DT on the ring frame f and cutting of the tape DT finish, the supporting adhesive tape DT is released from holding by the tension mechanism 20. Then, the separation unit 23 moves on the ring frame f toward the tape supply unit 19 to separate the unnecessary supporting adhesive tape DT after cutting.

The cutter mechanism 24 is disposed below the supporting adhesive tape DT on which the ring frame f is mounted. When the supporting adhesive tape DT is joined to the ring frame f by the joining unit 21, the supporting adhesive tape DT is released from holding by the tension mechanism 20 and the cutter mechanism 24 moves upward. The cutter mechanism 24 which has moved upward cuts the supporting adhesive tape DT along the ring frame f.

The ring frame ascending/descending mechanism 26 is in a standby position above the position for joining the supporting adhesive tape DT to the ring frame f. The ring frame ascending/descending mechanism 26 moves downward when joining of the supporting adhesive tape DT on the ring frame f has finished, and suction-holds the ring frame f. At this time, the ring frame transportation mechanism 17 which has been holding the ring frame f returns to an initial position above the ring frame supply unit 16.

The ring frame ascending/descending mechanism 26 suction-holds the ring frame f and then moves upward to a position for joining the ring frame f and the wafer W together. At this time, the chuck table 15 on which the wafer W is suction-held also moves downward to the position for joining the ring frame f and the wafer W together.

The mount frame producing unit 27 includes a joining roller 28 having a peripheral face which can elastically be deformed. The joining roller 28 rolls while pressing a non-adhesive face of the supporting adhesive tape DT joined to the back face of the ring frame f.

The first mount frame transportation mechanism 29 vacuum-sucks a mount frame MF formed by integrating the ring frame f and the wafer W with each other and transfers it to a separation table (not shown) of the separation mechanism 30.

Figure 2:
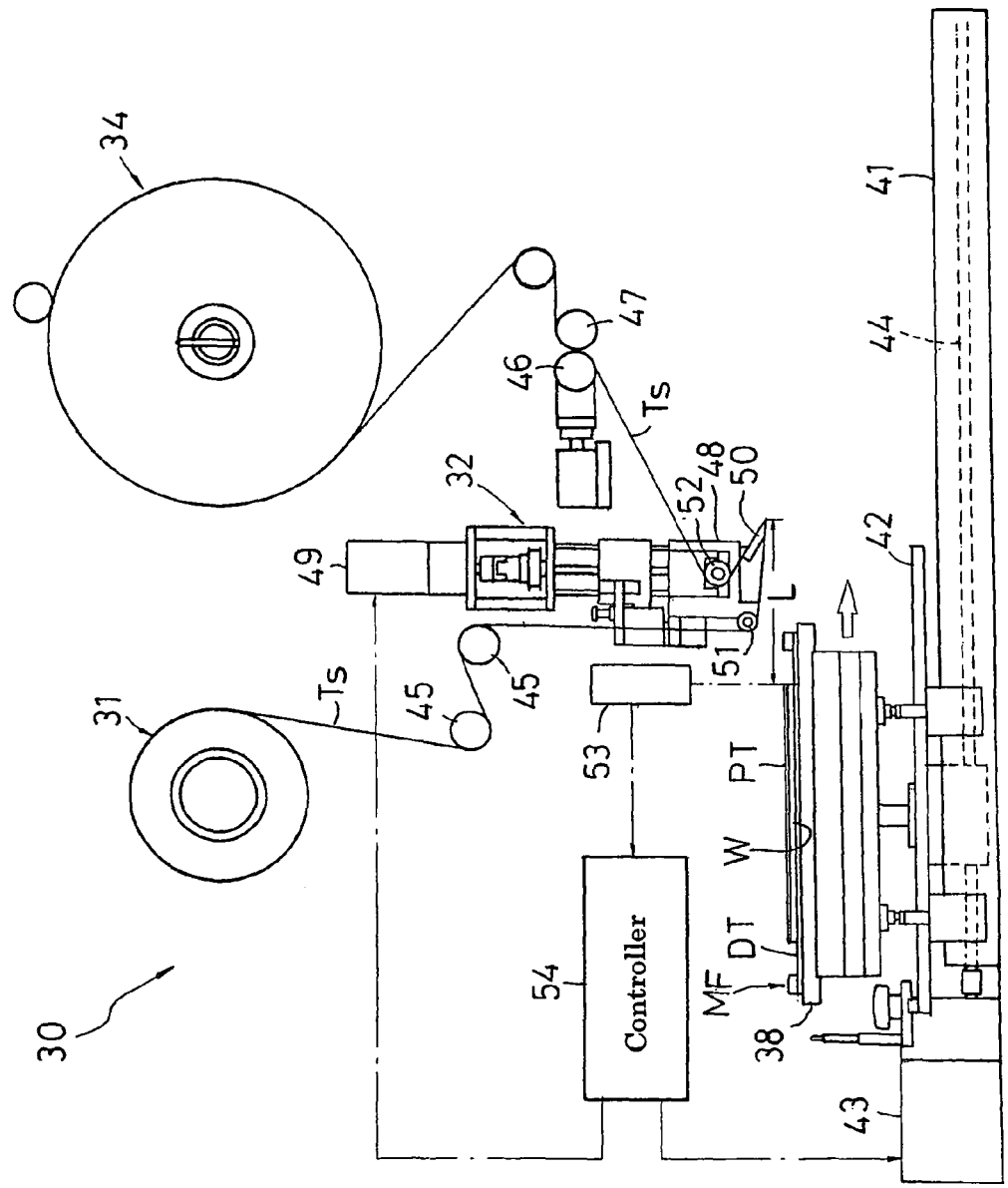
FIG. 2 is a side view of an operation process of a separation mechanism.

As shown in FIG. 2, the separation mechanism 30 includes the separation table 38 on which the wafer W is mounted and moved, a tape supply unit 31 for supplying the separating adhesive tape or the like (hereinafter, simply referred to as "separation tape") Ts, a separation unit 32 for joining and separating the separation tape Ts, and a tape collection unit 34 for collecting the separated separation tape Ts and protective tape PT. The configurations of the separation mechanism 30 excluding the separation table 38 is equipped to the apparatus main body in fixed positions. The separation table 38 corresponds to holding means, the tape supply unit 31 corresponds to the separating adhesive tape or the like supplying means, and the separation tape Ts corresponds to the separating adhesive tape or the like of the present invention, respectively. As the separating adhesive tape or the like, there are thermosetting adhesive tape having a thermosetting property, pressure-sensitive adhesive tape which is cured by heat, ultraviolet rays, and the like, thermoplastic adhesive tape, and the like, for example. These adhesive tapes may be replaced by a self-adhesive tape.

The separation table 38 is formed to vacuum-suck the mount frame MF from a back face side and is supported on a movable stage 42 supported for slide-moving in a forward/backward direction along a pair of left and right rails 41 disposed in a front-to-rear horizontal orientation. The movable stage 42 is driven by screw feeding by a screw shaft 44 driven normally and reversely by a pulse motor 43. The rails 41, the movable stage 42, the pulse motor 43, the screw shaft 44, and the like form driving means of the present invention.

The tape supply unit 31 guides and supplies the separation tape Ts lead out of a raw material roller through a guide roller 45 to a lower end of the separation unit 32.

The tape collection unit 34 guides, reels, and collects the separation tape Ts sent out of the lower end of the separation unit 32 upward through an advance roller 46 driven by a motor and a guide roller 47.

As shown in FIG. 2, the separation unit 32 is provided with a movable block 48 capable of moving upward/downward in parallel, and a pulse motor 49 for allowing the movable block 48 to move upward/downward by screw feeding. At a lower end of the movable block 48, an edge member 50 as a member for joining and separating the separation tape Ts and having a sharp tip end, a receiving guide roller 51 for guiding the supplied separation tape Ts to the tip end of the edge member 50, and a send-out guide roller 52 for guiding and sending out the separation tape Ts turned up at the tip end of the edge member 50 toward the tape collection unit 34 are provided. The edge member 50 is formed of a plate having a width greater than a diameter of the wafer and is attached and fixed in an attitude with its tip end tilted down. The movable block 48, the pulse motor 49, and the like form ascending/descending means of the present invention.

The separation unit 32 is equipped with a reflection-type photosensor 53 as detecting means for detecting an end edge of the protective tape PT in a non-contact manner at a position ahead of the edge member 50 in a joining direction of the separation tape. Used as this photosensor 53 is a sensor for emitting a laser light beam having a predetermined wavelength toward a surface of the protective tape PT at a position a predetermined distance L ahead of the tip end of the edge member 50 and for receiving the reflected light. In other words, detection information from this photosensor 53 is transmitted to a controller 54 for controlling actuation of the pulse motor 43 for driving the separation table 38 for forward/backward movements and the pulse motor 49 for driving the edge member 50 for ascent/descent. In a case of this embodiment, the wavelength of the emitted laser light beam is a short wavelength of 0.6 to 1 μm, for example. The photosensor 53 corresponds to detecting means and the controller 54 corresponds to controlling means of the present invention.

The second mount frame transportation mechanism 35 vacuum-sucks the mount frame MF swept out of the separation mechanism 30 and transfers it to the turn table 36.

The turn table 36 brings the mount frame MF into alignment and puts it into the mount frame collection unit 37. In other words, if the mount frame MF is mounted on the turn table 36 by the second mount frame transportation mechanism 35, the mount frame MF is brought into alignment on the basis of an orientation flat of the wafer W, a positioning shape of the ring frame f, and the like. Moreover, in order to change a housed orientation of the mount frame MF in the mount frame collection unit 37, the turn table 36 turns. The turn table 36 pushes the mount frame MF out with a pusher (not shown) after the housed orientation is determined to put the mount frame MF into the mount frame collection unit 37.

The mount frame collection unit 37 is mounted on a mount table (not shown) which can move upward/downward. In other words, when the mount table moves upward/downward, the mount frame MF pushed out with the pusher can be housed in an arbitrary stage of the mount frame collection unit 37.

Next, a cycle of operations of the apparatus of the aforementioned embodiment will be described with reference to FIGS. 1 to 8B.

The wafer holder of the robot arm 4 is inserted into the clearance in the cassette C. The wafers W are taken out one by one while being suction-held from below. The taken-out wafer W is transported to the alignment stage 7.

The wafer W is mounted on the holding table by the robot arm 4 and suction-held from the back face. At this time, a level of suction of the wafer W is detected by a pressure gage (not shown) and is compared with the reference value determined in advance in relation to a pressure value during normal operation.

If an abnormal condition of suction is detected, the wafer W is pressed from its surface by the pressing plate 6 and the wafer W is suction-held in a flat state after the warpage has been corrected. The wafer W is brought into alignment on the basis of the orientation flat or the notch.

When alignment on the alignment stage 7 has been finished, the ultraviolet irradiation unit 14 irradiates the surface of the wafer W with the ultraviolet rays.

After the wafer W has been subjected to the ultraviolet irradiation, the wafer W is transported to the next mount frame producing unit 27 together with the alignment stage 7 while being suction-held on the holding table. In other words, the alignment stage 7 moves to the intermediate position between the chuck table 15 and the ring frame ascending/descending mechanism 26.

If the alignment stage 7 is on standby in the predetermined position, the chuck table 15 positioned above moves downward and a bottom face of the chuck table 15 comes in contact with the wafer W to start vacuum suction. If the vacuum suction by the chuck table 15 starts, suction-holding by the holding table is released and the wafer W is received by the chuck table 15 with the warpage of the wafer W having been corrected and the wafer W being held in the flat state. The alignment stage 7 which has handed the wafer W returns to the initial position.

Next, the multiple-stacked ring frames f housed in the ring frame supply unit 16 are taken out one by one while being vacuum-sucked from above by the ring frame transportation mechanism 17. The taken-out ring frame f is brought into alignment on the alignment stage (not shown) and then transported to the supporting adhesive tape above the supporting adhesive tape DT.

If the ring frame f is held by the ring frame transportation mechanism 17 and in the joining position of the supporting adhesive tape DT, the tape supply unit 19 starts supplying of the supporting adhesive tape DT. Simultaneously, the joining roller 22 moves to a joining start position.

When the joining roller 22 has reached the joining start position, the tension mechanism 20 holds the opposite ends of the supporting adhesive tape DT in the width direction to apply tension in the tape width direction.

Then, the joining roller 22 moves upward and presses and joins the supporting adhesive tape DT against and onto the end of the ring frame f. When the joining roller 22 has joined the supporting adhesive tape DT to the end of the ring frame f, the joining roller 22 rolls to the standby position toward the tape supply unit 19. At this time, the joining roller 22 rolls while pressing the supporting adhesive tape DT from the non-adhesive face to join the supporting adhesive tape DT onto the ring frame f. When the joining roller 22 has reached a termination of the joining position, holding of the supporting adhesive tape DT by the tension mechanism 20 is released.

Simultaneously, the cutter mechanism 24 moves upward to cut the supporting adhesive tape DT along the ring frame f. When the cutting of the supporting adhesive tape DT has finished, the separation unit 23 moves toward the tape supply unit 19 to separate the unnecessary supporting adhesive tape DT.

Then, the tape supply unit 19 is actuated to unreel the supporting adhesive tape DT and the cut unnecessary portion of the tape is sent out to the tape collection unit 25. At this time, the joining roller 22 moves to the joining start position so as to join the supporting adhesive tape DT on the next ring frame f.

A frame portion of the ring frame f on which the supporting adhesive tape DT has been joined is suction-held by the ring frame ascending/descending mechanism 26 and moved upward. At this time, the chuck table 15 also moves downward. In other words, the chuck table 15 and the ring frame ascending/descending mechanism 26 move to the respective positions for joining the wafer W and the ring frame f together.

When the respective mechanisms 15, 26 have reached the predetermined positions, the respective mechanisms 15, 26 are held by holding mechanisms (not shown). Then, the joining roller 28 moves to the joining start position of the supporting adhesive tape DT and rolls while pressing the non-adhesive face of the supporting adhesive tape DT joined to the bottom face of the ring frame f to thereby join the supporting adhesive tape DT onto the wafer W. As a result, the mount frame MF is produced by integrating the ring frame f and the wafer W with each other.

When the mount frame MF has been produced, the chuck table 15 and the ring frame ascending/descending mechanism 26 move upward. At this time, the holding table (not shown) moves to a position under the mount frame MF and the mount frame MF is mounted on the holding table. The mounted mount frame Mf is suction-held by the first mount frame transportation mechanism 29 and transferred to the separation table 38.

Figure 5:
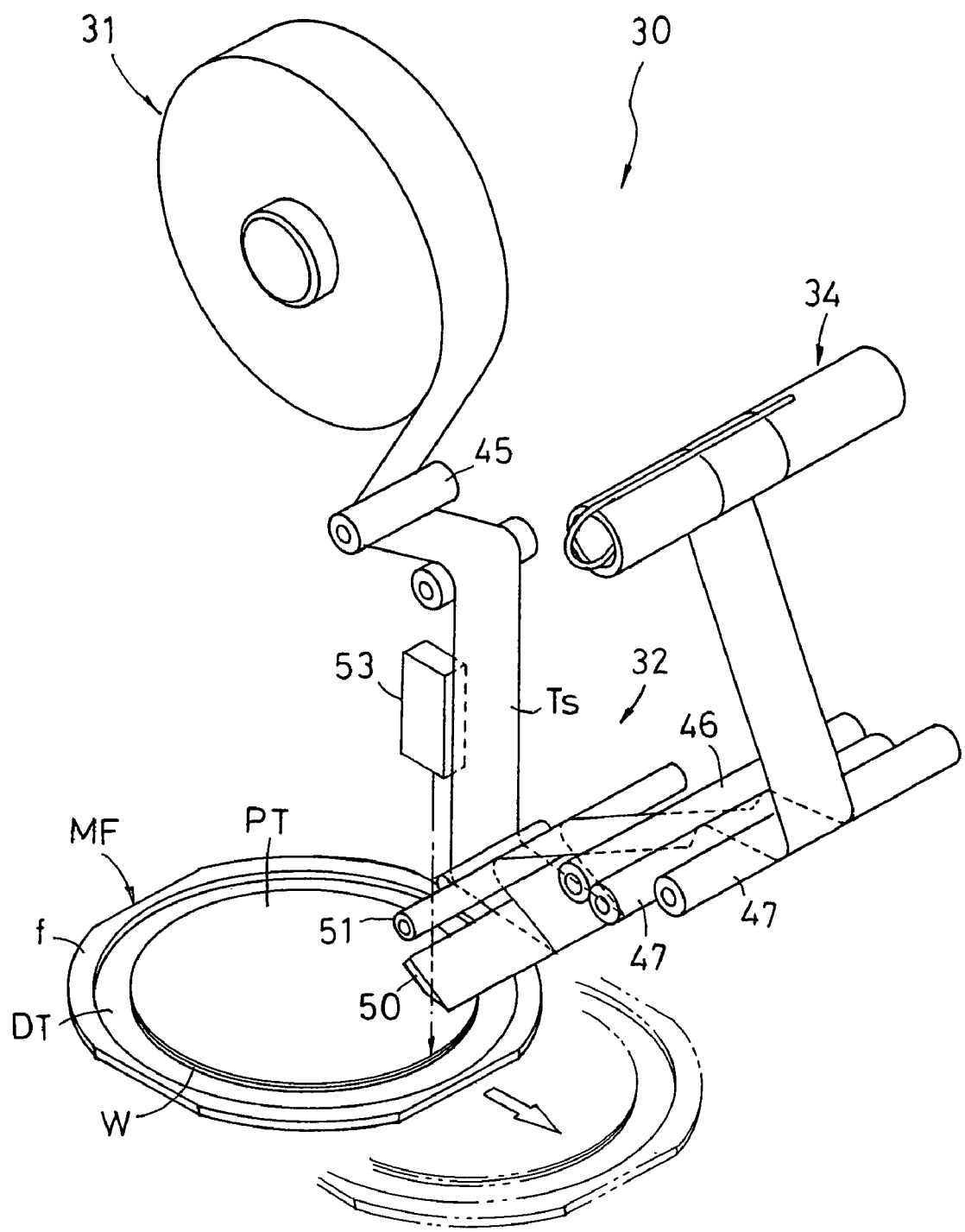
FIG. 5 is a perspective view of the operation process of the separation mechanism.

The separation table 38 on which the mount frame MF is mounted moves forward toward a position under the separation unit 32 as shown in FIGS. 2 and 5. In this process, from a change in a light intensity of the reflected light when the laser light beam emitted vertically downward from the photosensor 53 is reflected and returned or from a time difference between returning times, a height of the surface of the protective tape PT and an adhesive face of the supporting adhesive tape DT exposed between the ring frame f and the wafer W are determined to thereby detect the front end edge of the protective tape PT. The pulse motor 43 is controlled to be actuated so that the separation table 38 moves from the detected position of the separation table 38 at this time over a distance L from the photosensor 53 to the tip end position of the edge member 50 and known in advance by the pulse motor 43 and forward movement of the separation table 38 is stopped temporarily in the detected position. In other words, when the front end edge of the protective tape PT has reached the position directly below the tip end of the edge member 50, the forward movement is automatically and temporarily stopped.

Figure 3:
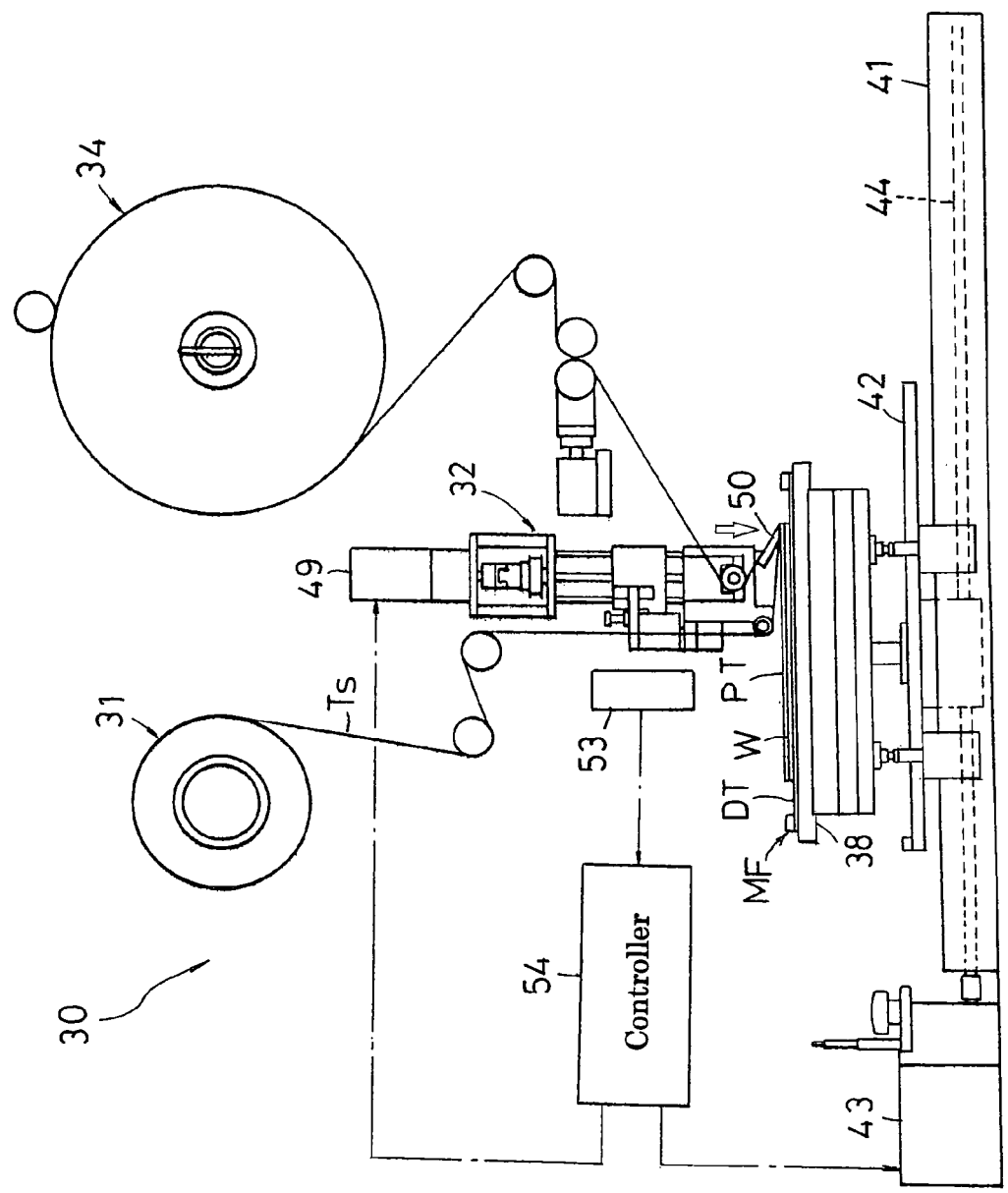
FIG. 3 is a side view of the operation process of the separation mechanism.
Figure 6:
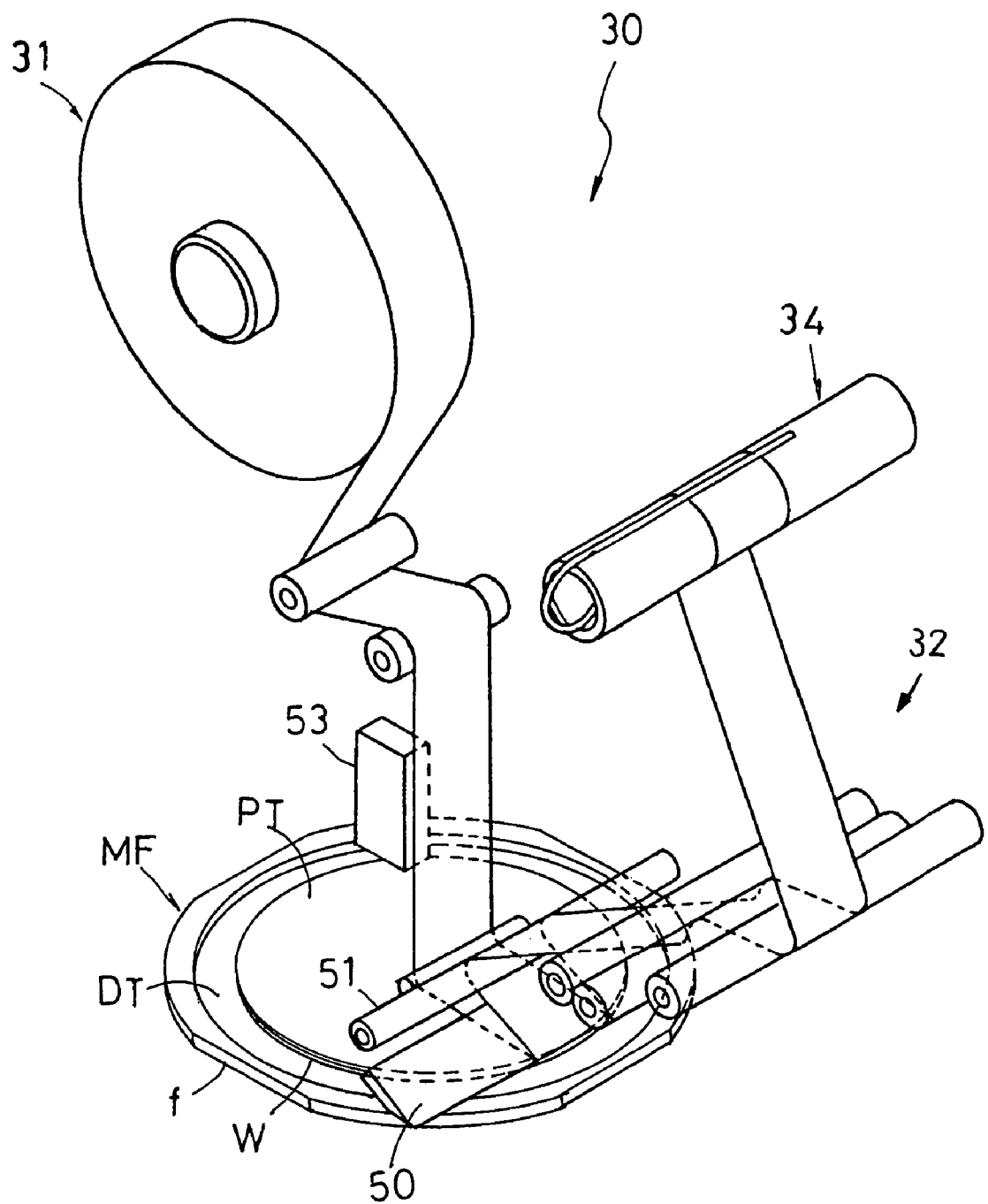
FIG. 6 is a perspective view of the operation process of the separation mechanism.
Figure 8A:
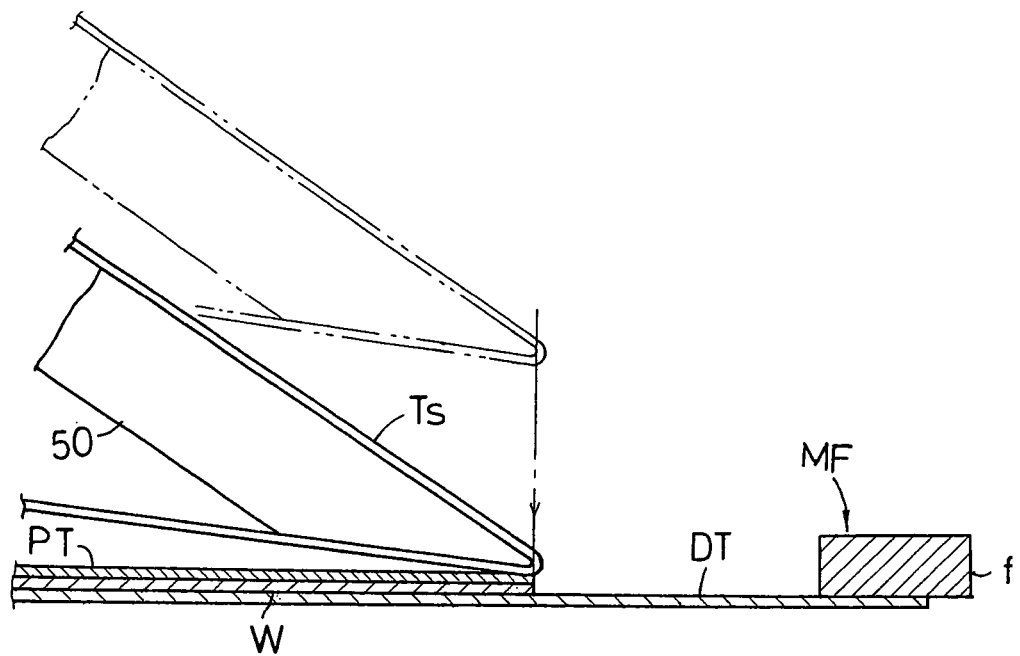
FIGS. 8A and 8B are enlarged side views of a main portion and showing joining actuation and separating actuation of the separation mechanism.

When the separation table 38 has temporarily been stopped, as shown in FIGS. 3 and 6, the pulse motor 49 is controlled to be actuated to move the movable block 48 downward. Then, the edge member 50 is moved downward with the separation tape Ts supplied from the tape supply unit 31 wound around the member 50 and, as shown in FIG. 8A, the separation tape Ts is pressed against and joined onto an upper face of the front end of the protective tape Pt with a predetermined pressing force with the tip end of the edge member 50.

Figure 4:
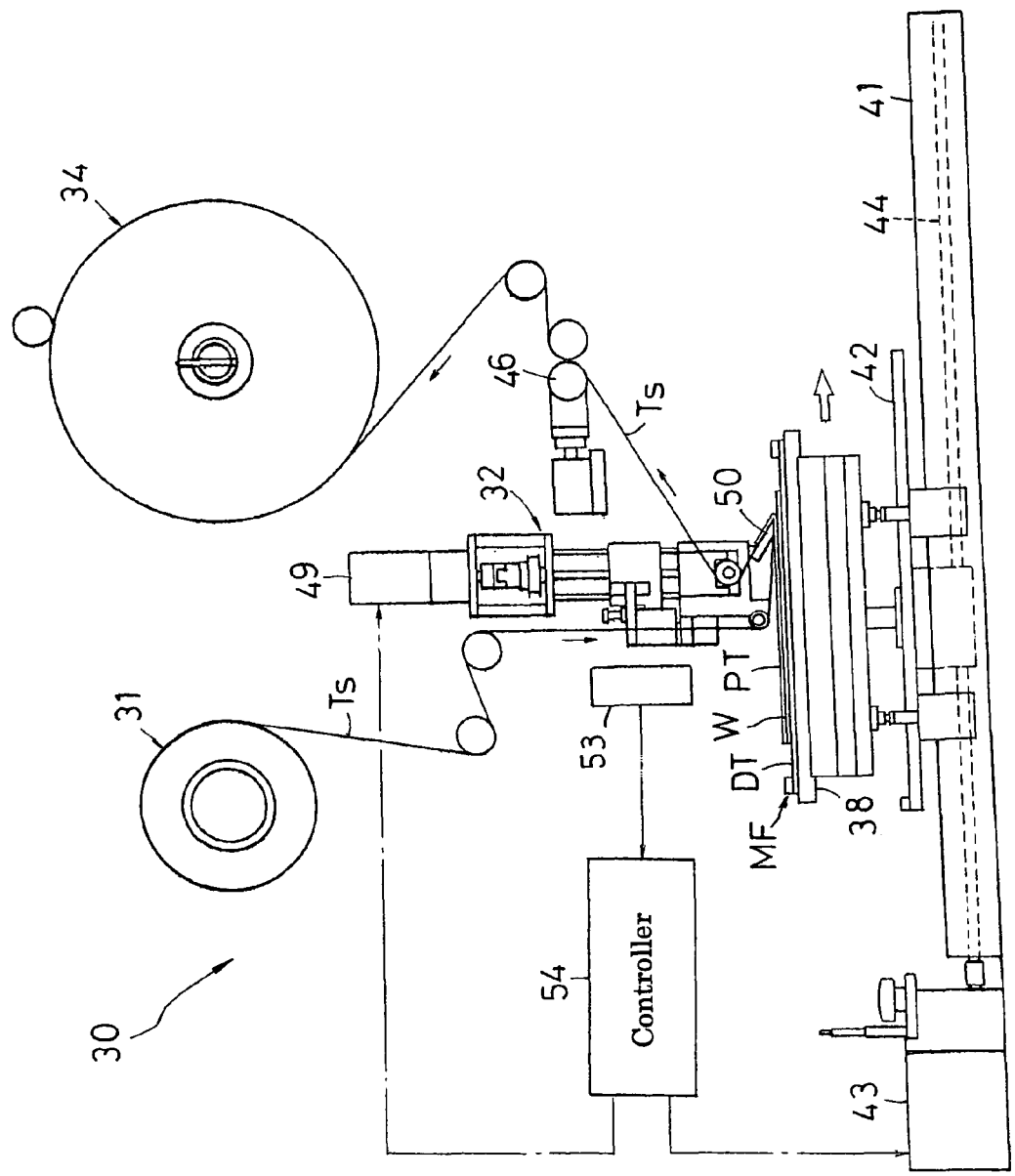
FIG. 4 is a side view of the operation process of the separation mechanism.
Figure 7:
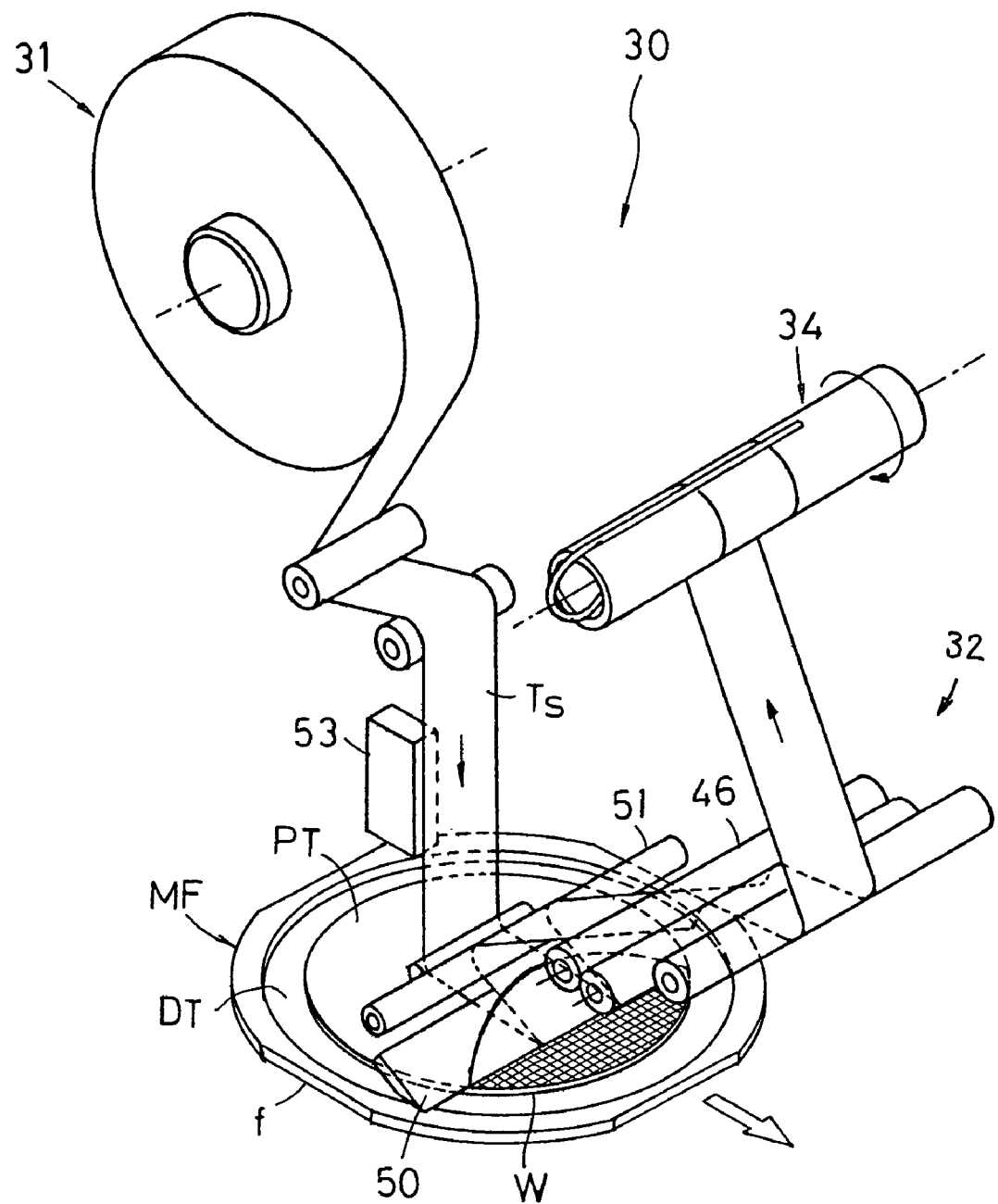
FIG. 7 is a perspective view of the operation process of the separation mechanism.
Figure 8B:
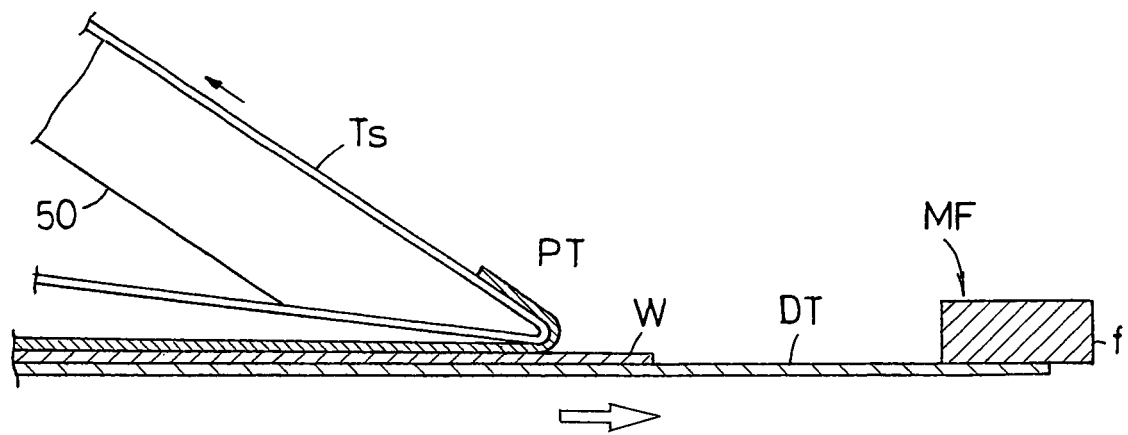

When the joining of the protective tape PT onto the front end of the protective tape PT has finished, as shown in FIGS. 4 and 7, the separation table 38 starts to move forward again while pressing the separation tape Ts against the protective tape PT with the edge member 50 and the separation tape Ts is reeled toward the tape collection unit 34 at a speed suited to this moving speed. By this operation, as shown in FIG. 8B, the edge member 50 joins the separation tape Ts onto the protective tape Pt on the surface of the wafer W while pressing the separation tape Ts and simultaneously separates the protective tape PT together with the separation tape Ts from the surface of the wafer W while separating the joined separation tape Ts.

At a time point when the pulse motor has been controlled to be actuated so that the edge member 50 moves forward over a distance corresponding to the diameter of the wafer from the joining start position of the separation tape to which the edge member 50 has been actuated to move downward, the separation unit 32 is restored to the initial state. In other words, at a time point when the edge member 50 has reached a rear end edge of the protective tape PT and the protective tape PT has completely been separated from the surface of the wafer, the edge member 50 is controlled to move upward and the separation unit 32 is restored to the initial state.

The mount frame MF after separating of the protective tape PT has finished is moved to the standby position of the second mount frame transportation mechanism 35 by the separation table 38.

The mount frame MF swept out by the separation mechanism 30 is transferred to the turn table 36 by the second mount frame transportation mechanism 35. The transferred mount frame MF is brought into alignment by the orientation flat or the notch and the housed orientation is adjusted. After the alignment and determination of the housed orientation, the mount frame MF is pushed out with the pusher and housed in the mount frame collection unit 37.

As described above, when the separation table 38 on which the mount frame MF is mounted moves to the position under the separation unit 32, in other words, during relative movement of the separation table 38 and the separation unit 32, the laser light beam is emitted vertically downward from the photosensor 53 and the change in the light intensity of the reflected light and the time difference between the returning times are measured to thereby accurately detect the front end edge of the protective tape PT. By horizontally moving the separation table 38 over the predetermined distance L to the tip end of the edge member 50 from the time point when the front end edge of the protective tape PT has been detected, the edge member 50 can be positioned directly above the front end edge of the protective tape PT. Moreover, by moving the edge member 50 downward from this position, the separation tape Ts can be joined just from the front end edge of the protective tape PT without lying off or short of the front end edge. In other words, when the separation tape Ts is joined from the front end edge of the protective tape PT, it is possible to prevent the separation tape Ts from falling between the wafer W and the ring frame f and from adhering and to prevent breakage of the wafer W when the protective tape PT is separated together with the separation tape Ts. Moreover, because the separation tape Ts can be separated together with the protective tape PT with the separation tape Ts kept in close contact with the end edge of the protective tape PT, it is possible to suppress occurrence of the separation error.

Another Embodiment 1

In the above embodiment, while the mount frame MF moves forward to pass through the position under the separation unit 32, the edge member 50 simultaneously joins and separates the separation tape Ts to and from the protective tape PT. However, it is also possible to join and separate the separation tape Ts to and from the protective tape PT in separate processes in order and there is one example shown in FIGS. 9 to 12.

In this embodiment, while the separation table 38, the tape supply unit 31, and the tape collection unit 34 are respectively disposed in fixed positions, the separation unit 32 of the separation mechanism 30 and the photosensor 53 provided to the separation unit 32 are moved horizontally forward/backward by a drive mechanism (not shown) and are actuated as follows.

Figure 9:
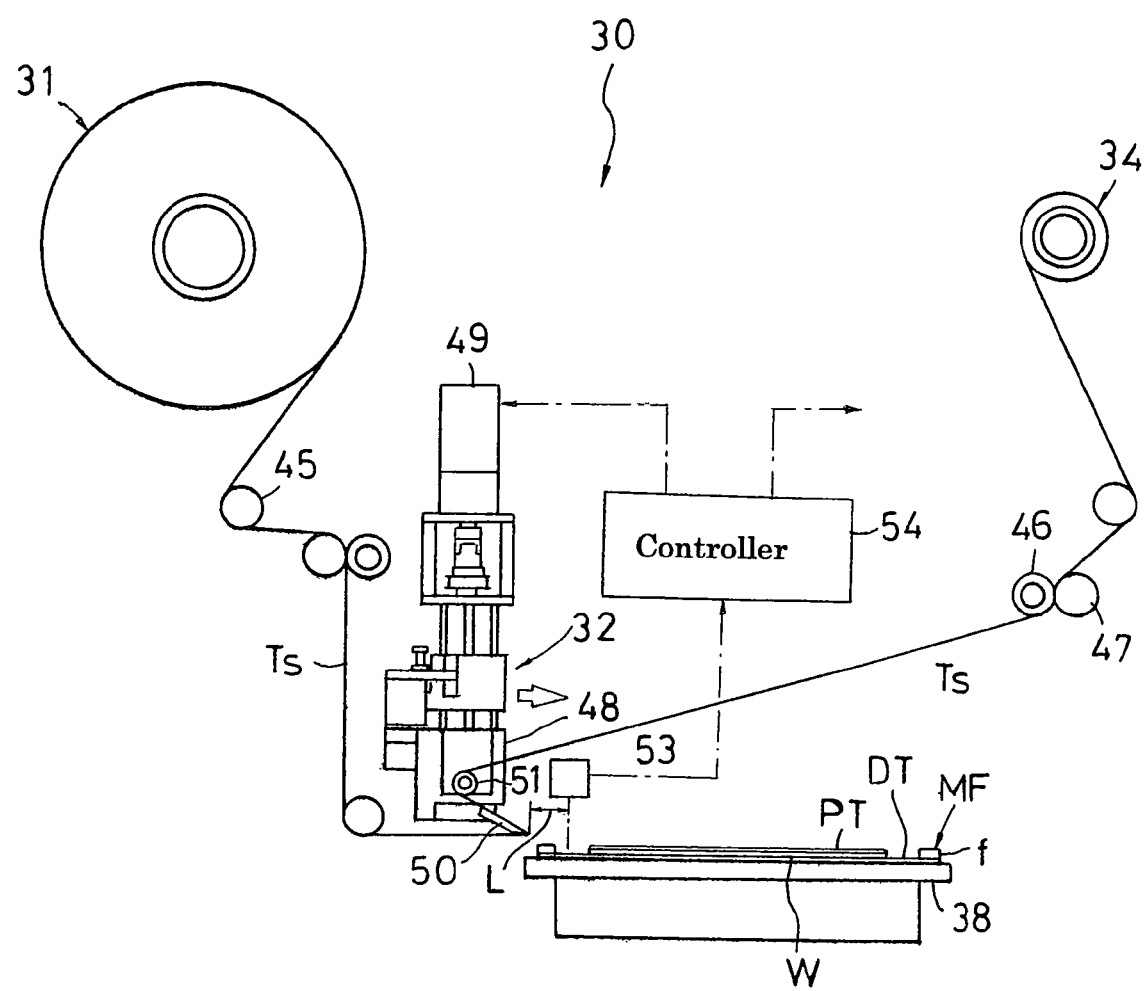
FIG. 9 is a side view showing an explanation of an operation of a separation mechanism of another embodiment.

First, as shown in FIG. 9, the separation unit 32 is moved forward from a standby position displaced from the separation table 38 and, during the movement, the front end edge of the protective tape PT is detected by the photosensor 53 disposed a predetermined distance L ahead of the edge member 50.

Figure 10:
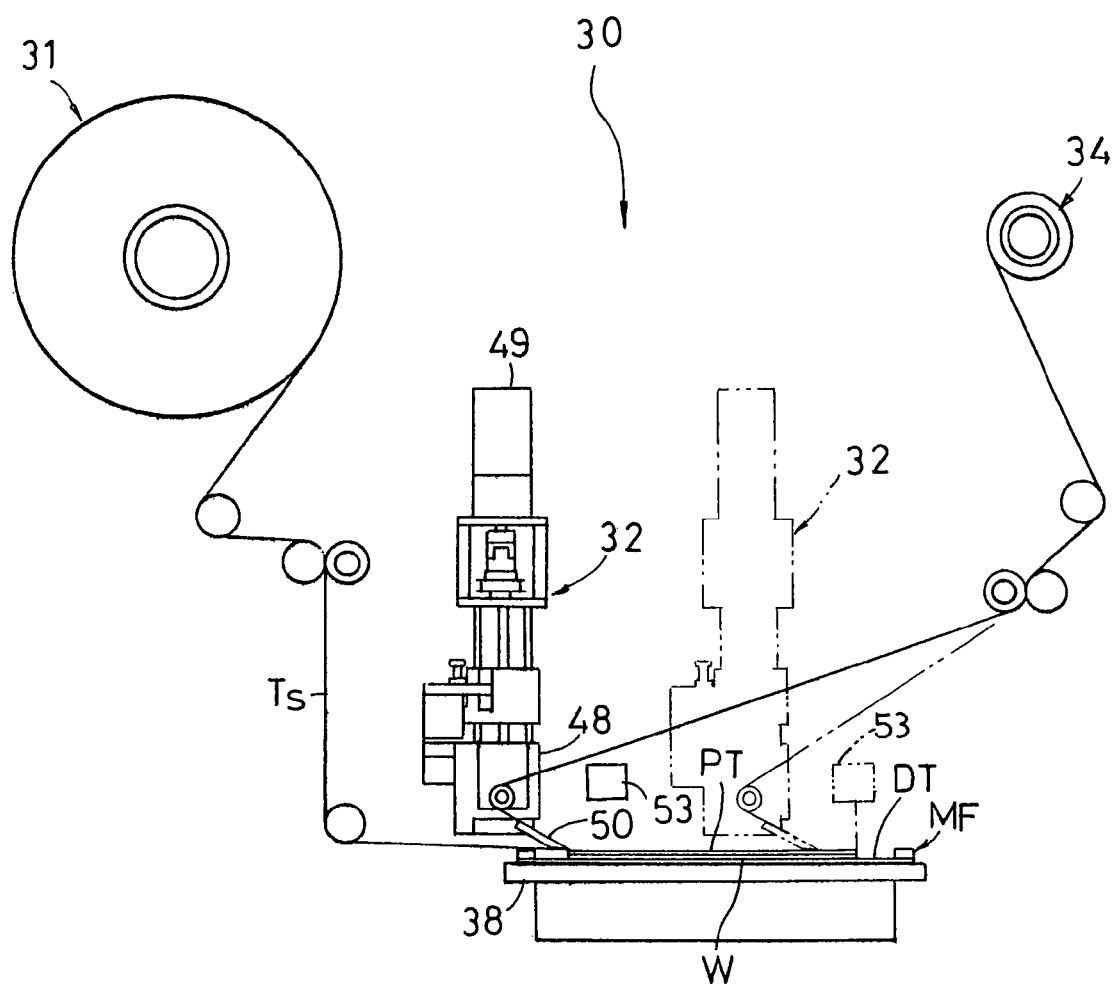
FIG. 10 is a side view showing an explanation of an operation of a separation mechanism of another embodiment.

When the front end edge of the protective tape PT has been detected, as shown in FIG. 10, if the mount frame MF moves forward over the predetermined distance L from the position where the end edge has been detected, the movement is stopped temporarily and the edge member 50 is controlled to move down to press the separation tape Ts against the upper face of the front edge of the protective tape PT similarly to the previous example.

Then, as illustrated in phantom lines in FIG. 10, the mount frame MF is moved forward while kept in the above pressed state to seamlessly join the separation tape Ts on the upper face of the protective tape PT. Also, during this joining movement, the rear end edge of the protective tape PT is detected by the photosensor 53.

Figure 11:
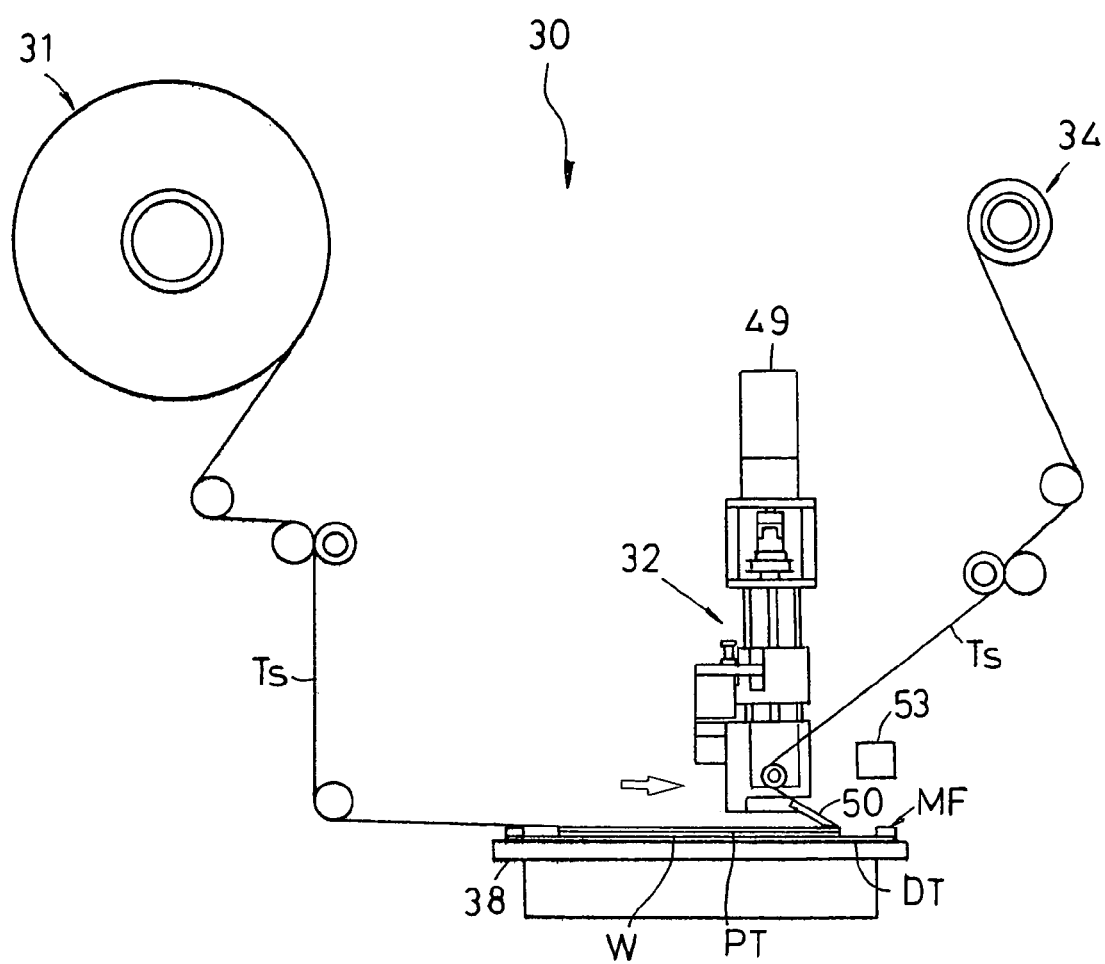
FIG. 11 is a side view showing an explanation of an operation of a separation mechanism of another embodiment.

Then, as shown in FIG. 11, after forward movement over the predetermined distance L from the time point when the rear end edge of the protective tape PT has been detected by the photosensor 53, the movement is stopped temporarily. At this time, the tip end of the edge member 50 is aligned with the rear end of the protective tape PT to thereby prevent the tip end of the edge member 50 from overshooting the end edge of the wafer and falling and the down-facing adhesive face of the separation tape Ts from coming in contact with and being joined to the up-facing adhesive face of the supporting adhesive tape DT.

Figure 12:
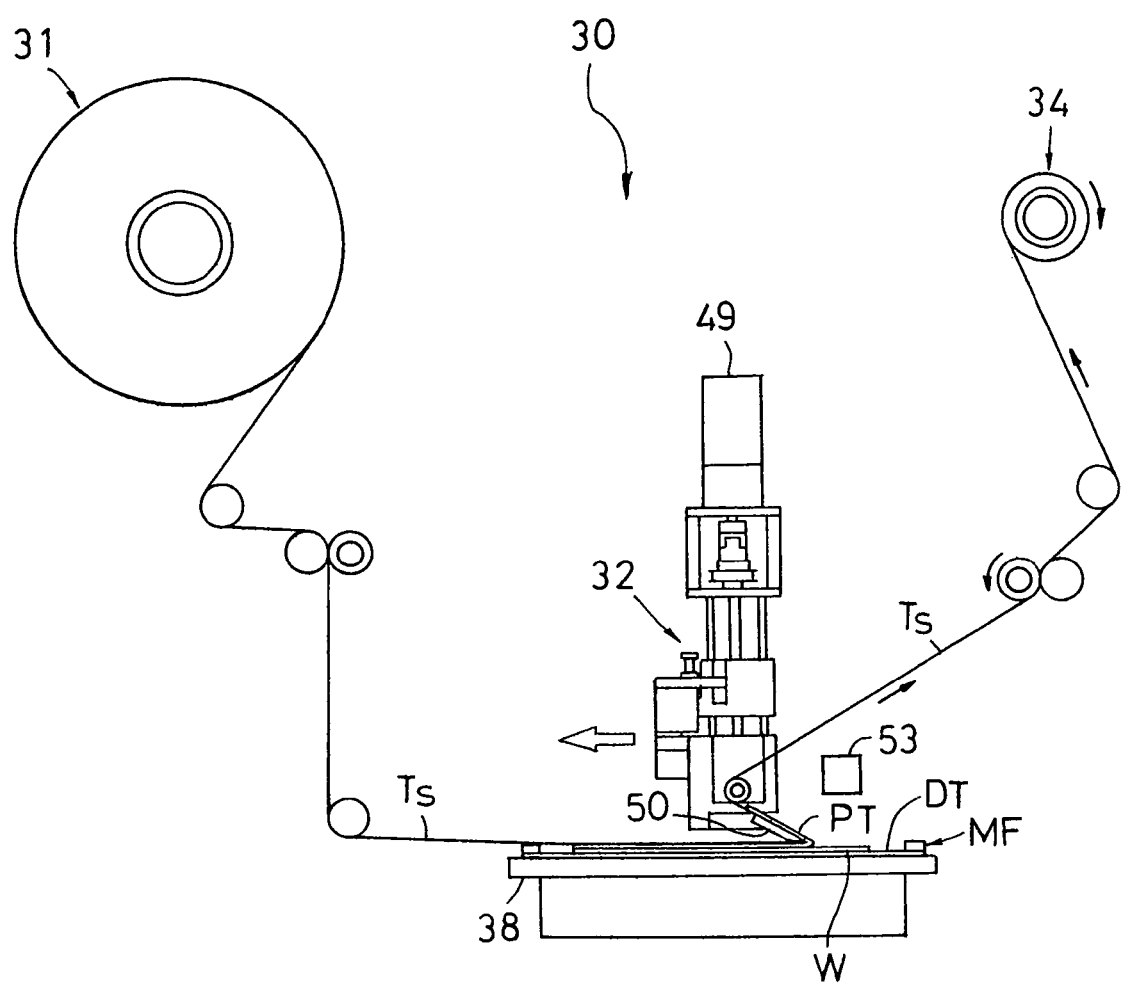
FIG. 12 is a side view showing an explanation of an operation of a separation mechanism of another embodiment.

Then, as shown in FIG. 12, by moving the mount frame MF backward from the stop position as a starting point while reeling and collecting the separation tape Ts at the speed suited to the speed of the backward movement, the protective tape PT is separated from the surface of the wafer together with the separation tape Ts.

The aforementioned apparatus of another embodiment can also exert similar effects to those of the aforementioned apparatus of the main embodiment.

Another Embodiment 2

In this embodiment, a case in which thermosetting adhesive tape is used as the separation tape Ts, the separation tape Ts is joined to the protective tape PT with the edge member 50, and the separation tape Ts and the protective tape PT are separated together from the wafer W will be described as an example. Therefore, this embodiment is different from the above embodiment in configurations of the separation tape Ts supplied from the tape supply unit 31 and the edge member 50 shown in FIG. 1 and is similar to the above embodiment in other structures. The similar configurations will merely be provided with the same reference numerals and the different configurations will be described concretely.

Figure 13:
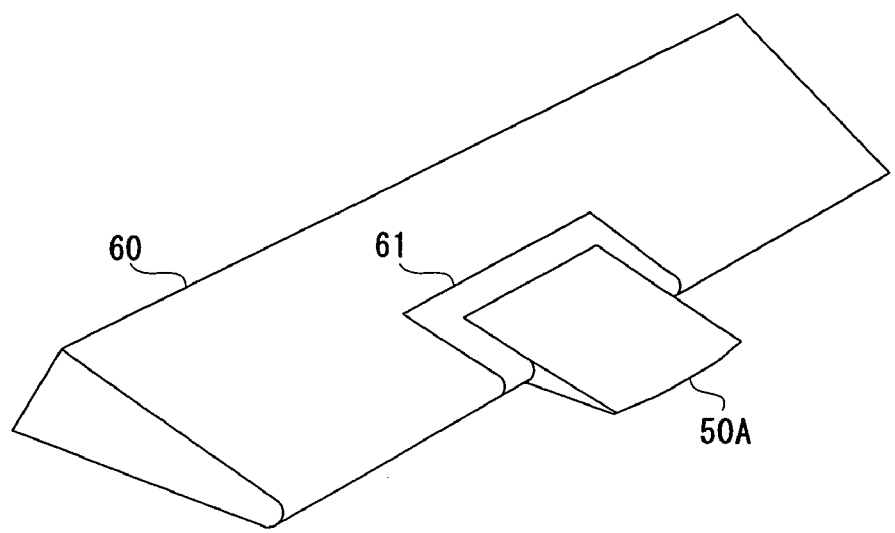
FIG. 13 is a perspective view showing a portion around an edge member of another embodiment.
Figure 14:
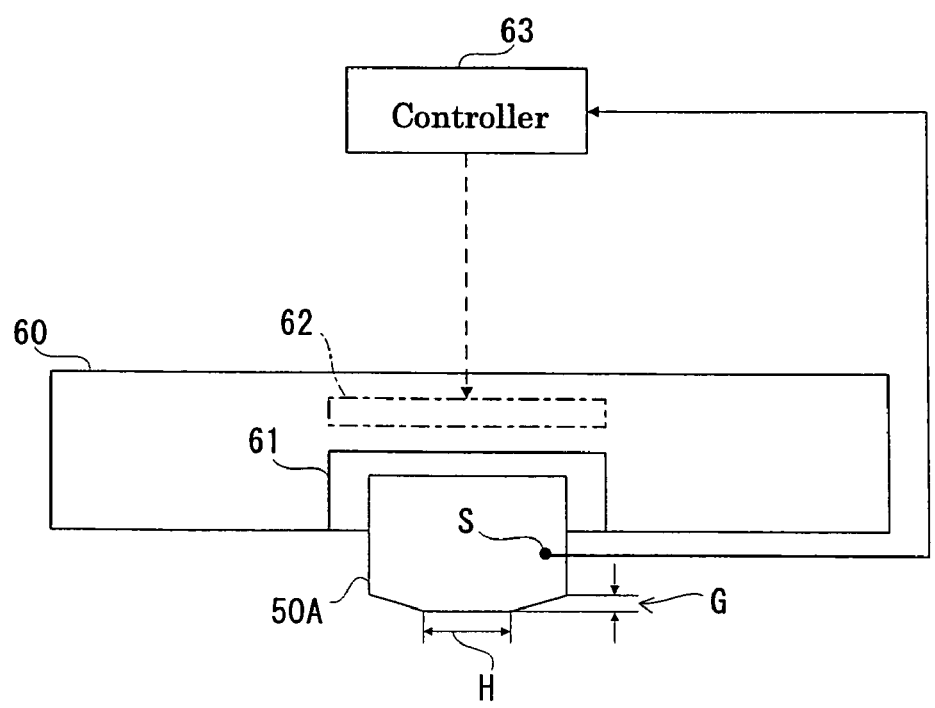
FIG. 14 is a plan view showing a configuration of a main portion around the edge member of another embodiment.

FIG. 13 is a perspective view showing a portion around an edge member according to the present embodiment and FIG. 14 is a plan view showing a configuration of a main portion around the edge member.

As shown in FIGS. 13 and 14, the edge member 50A is attached to a rectangular notch formed at a center of a support member 60 having a width greater than the diameter of the wafer and tapered toward a tip end through a heat insulator 61. The edge member 50A is in a shape having substantially the same width as the separation tape Ts and a sharp tip end. A central portion H of the tip end is linear so as to come in close contact with the separation tape Ts and opposite sides of the central portion H are gently inclined toward a base end of the edge member 50A. In the case of this embodiment, the width of the separation tape Ts is 30 mm, while the width of the edge member 50A is 50 mm, a width of the tip end central portion H is 35 mm, and each of the opposite sides of the central portion H is inclined at such an angle that a gap G between the central tip end and a side edge tip end is 1 mm. The shape of the tip end of the edge member 50A may properly be changed in design depending on the type of the separation tape Ts to be used.

The support member 60 is attached to the separation unit 32 similarly to the edge member 50 in the above embodiment. Inside the support member 60, a heater 62 as heating means is incorporated. The heater 62 transfers heat generated by heating the support member 60 to the edge member 50A through the heat insulator 61 to thermally cure an adhesive of the separation tape Ts thorough polymerization reaction, the separation tape Ts in close contact with the edge member 50A. In other words, as shown in FIG. 14, a temperature of the tip end of the edge member 50A is detected by a contact or non-contact sensor S and fed back to a controller 63 and a temperature supplied from the heater 62 is controlled so that the tip end of the edge member 50A is at a predetermined temperature. If the edge member 50A is in a large-sized shape, the heater 62 may be incorporated in the edge member 50A.

As the thermosetting separation tape Ts, hot melt may be utilized, for example.

By using the edge member 50A having the aforementioned configuration and joining the separation tape Ts onto the protective tape PT while heating the edge member 50A, the adhesive of the thermosetting separation tape Ts is thermally cured thorough the polymerization reaction to thereby reliably join the separation tape Ts onto the whole face of the protective tape PT. Therefore, in separating the separation tape Ts, it is possible to accurately separate the separation tape Ts from the end edge of the wafer W in a state in which the protective tape PT is integrated with and joined to the separation tape Ts having stronger adhesion than the protective tape PT.

The present invention is not limited to the aforementioned embodiments but may be modified and embodied as follows.

(1) Although the edge member 50 is used as the joining member for the separation tape Ts in the above embodiments, a roller may be utilized. In this case, the roller preferably has a hard peripheral face and as small a roller diameter as possible.

(2) As means for detecting the end edge of the protective tape PT in a non-contact manner, in addition to use of the photosensor 53 as described above, analysis of images captured by a CCD camera or the like can be performed.

(3) In the above main embodiment, a position of the mount frame MF may be fixed and the separation unit 32 may be moved in the horizontal direction.

(4) In the above embodiments, the edge member (joining member) 50 is controlled to move downward to press and join the separation tape Ts against and onto the protective tape PT. Reversely, the holding table which holds the mount frame MF may be moved upward to the edge member 50 which is not actuated for ascent/descent.

(5) Although a roll of strip type of tape is used while being unreeled as the separation tape Ts for separating the protective tape PT in the above embodiments, adhesive or self-adhesive tape or adhesive or self-adhesive sheet produced by cutting the tape into sheets of lengths.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for joining a separating adhesive tape or the like while pressing it from its non-adhesive face side with a joining member onto a protective tape joined to a surface of a semiconductor wafer held on a ring frame through a supporting adhesive tape, and separating the separating adhesive tape or the like, thereby separating the protective tape together with the separating adhesive tape or the like from the surface of the semiconductor wafer, the apparatus comprising:
    an alignment stage to bring the semiconductor wafer into alignment by an orientation flat or a notch;
    a separation table on and by which a mount frame, in which the semiconductor wafer with the protective tape is supported on the ring frame through the supporting adhesive tape, is mounted and held horizontally;
    a separating adhesive tape or the like supplying mechanism for supplying the strip type of separating adhesive tape or the like toward the joining member;
    an ascending/descending mechanism for relatively moving the joining member, around and to which the separating adhesive tape or the like is wound and supplied, upward/downward with respect to the separation table;
    a driving mechanism for relatively and horizontally moving the separation table and the joining member;
    a sensor for detecting a front end edge of the protective tape in a non-contact manner by emitting a laser light beam from ahead of a separation direction of the protective tape in conjunction with a separating operation to horizontally move either the separation table or the joining member in the separation direction of the protective tape and receiving a reflected light from a surface of the moving protective tape;
    a controlling unit for controlling the ascending/descending mechanism so as to stop the horizontal movement at a time point when a joining operating portion of the joining member has reached a position directly above the front end edge of the protective tape and to relatively move the joining member close to the separation table to press the separating adhesive tape or the like wound around the joining member against the protective tape on the basis of a detection result of the sensor and for controlling driving of the driving mechanism so as to start the relative movement of the separation table and the joining member again from the stop position as a starting point to simultaneously separate the separating adhesive tape or the like onto the protective tape and separate the separating adhesive tape; and
    a tape collecting unit for collecting the protective tape integral with the separated separating adhesive tape or the like.

2. The apparatus according to claim 1, wherein
the sensor is disposed at a predetermined distance from the joining member in a horizontal direction and is formed to horizontally move together with the joining member with respect to the separation table.

3. The apparatus according to claim 1, wherein
the sensor is a reflection-type photosensor which emits light with a predetermined wavelength toward the surface of the protective tape and receives light reflected from the surface of the protective tape.

4. The apparatus according to claim 1, wherein
the sensor is an optical camera, and
the control unit uses image data obtained by the optical camera, operates the driving mechanism in accordance with positional information obtained by image analyzing processing, and controls relative positions of the joining member and the separation table.

5. The apparatus according to claim 1, wherein the joining member is formed of an edge member having a sharp tip end.

6. The apparatus according to claim 5, wherein the separating adhesive tape or the like is a thermosetting adhesive tape, the apparatus further comprising:

heater for heating the edge member.

7. The apparatus according to claim 1, wherein the joining member is formed of a roller.

8. The apparatus according to claim 1, wherein the control unit operates the driving mechanism to drive the joining member for horizontal movement and ascent/descent with respect to the separation table.

9. The apparatus according to claim 1, wherein the control unit operates the driving mechanism to drive the separation table for horizontal movement and ascent/descent with respect to the joining member.

* * * * *